(12) United States Patent
Shimoda et al.

(10) Patent No.: US 10,189,232 B1
(45) Date of Patent: Jan. 29, 2019

(54) ELECTRONIC DEVICE MANUFACTURING APPARATUS

(71) Applicant: NHK SPRING CO., LTD., Yokohama-shi, Kanagawa (JP)

(72) Inventors: Takeshi Shimoda, Kanagawa-ken (JP); Masaru Inoue, Kanagawa-ken (JP)

(73) Assignee: NHK SPRING CO., LTD., Kanagawa (JP)

( * ) Notice: Subject to any disclaimer, the term of this patent is extended or adjusted under 35 U.S.C. 154(b) by 0 days.

(21) Appl. No.: 15/683,005

(22) Filed: Aug. 22, 2017

(51) Int. Cl.
| | |
|---|---|
| *B32B 37/00* | (2006.01) |
| *B32B 37/06* | (2006.01) |
| *B29C 65/10* | (2006.01) |
| *B32B 38/00* | (2006.01) |
| *G11B 5/48* | (2006.01) |

(52) U.S. Cl.
CPC .......... *B32B 37/0046* (2013.01); *B29C 65/10* (2013.01); *B32B 37/06* (2013.01); *B32B 38/0036* (2013.01); *B32B 2457/00* (2013.01); *G11B 5/483* (2015.09); *G11B 5/4833* (2013.01)

(58) Field of Classification Search
CPC ....... B29C 5/10; B32B 37/06; B32B 38/0036; B32B 37/0046; B32B 37/0053; B32B 2457/00; G11B 5/483; G11B 5/4833
USPC ............. 156/497; 219/388, 399, 400, 137.42
See application file for complete search history.

(56) References Cited

U.S. PATENT DOCUMENTS

| | | | | |
|---|---|---|---|---|
| 4,976,811 A | * | 12/1990 | Siebert | .................... B29C 65/10 156/497 |
| 6,600,137 B1 | * | 7/2003 | Nonomura | ............. B23K 1/012 219/388 |
| 6,677,184 B2 | | 1/2004 | Kohashi | |
| 6,888,865 B2 | | 5/2005 | Kohashi | |
| 8,691,043 B2 | * | 4/2014 | Sampica | ............. B32B 37/1018 156/285 |

FOREIGN PATENT DOCUMENTS

| | | |
|---|---|---|
| JP | 07106749 A | 4/1995 |
| JP | 2001217499 A | 8/2001 |

* cited by examiner

*Primary Examiner* — Philip C Tucker
*Assistant Examiner* — Jimmy R Smith, Jr.
(74) *Attorney, Agent, or Firm* — Holtz, Holtz & Volek PC

(57) ABSTRACT

An electronic device manufacturing apparatus includes a conveyer, a plurality of heaters, gas supply source, narrow path part, and a plurality of guide parts. The conveyer conveys a work to which an uncured conductive adhesive agent is applied. The narrow path part includes a narrow path formed along a locus in which the conductive adhesive agent passes. The guide parts which guide the inert gas to feed into the narrow path include gas dispersion members which store the heat of the heaters and disperse the inert gas.

2 Claims, 11 Drawing Sheets

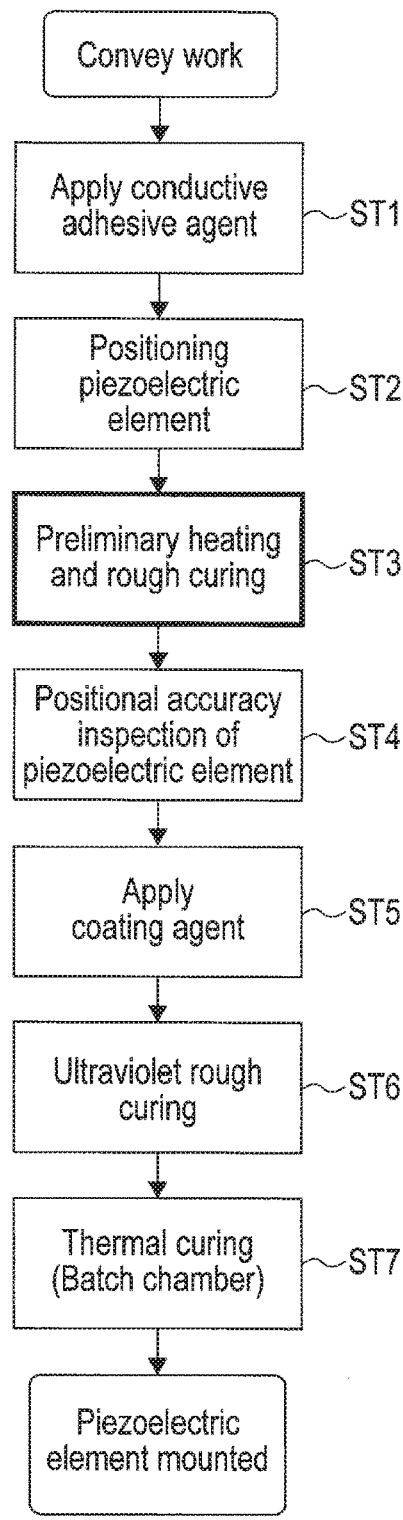
F I G. 3

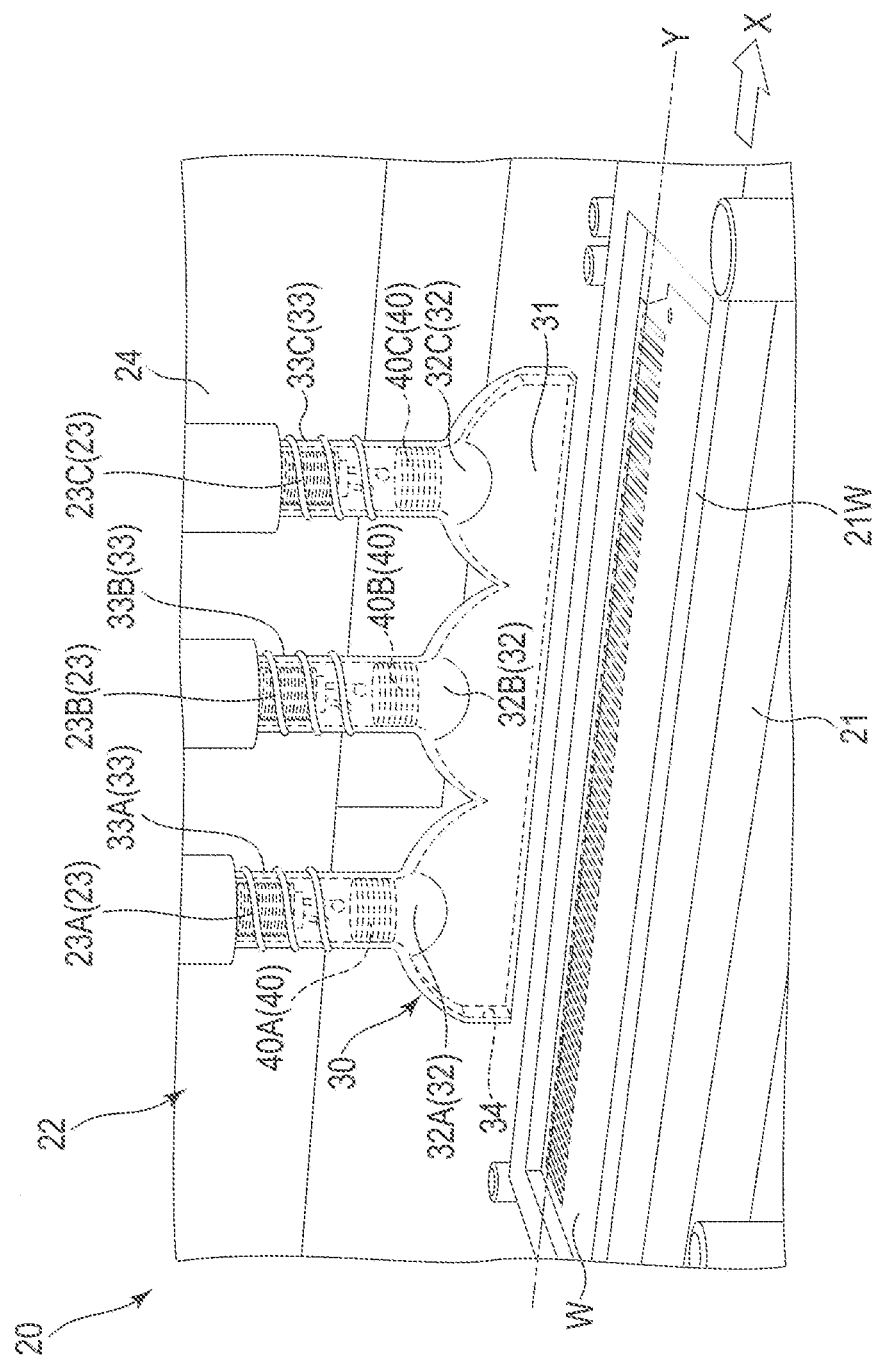
F I G. 4

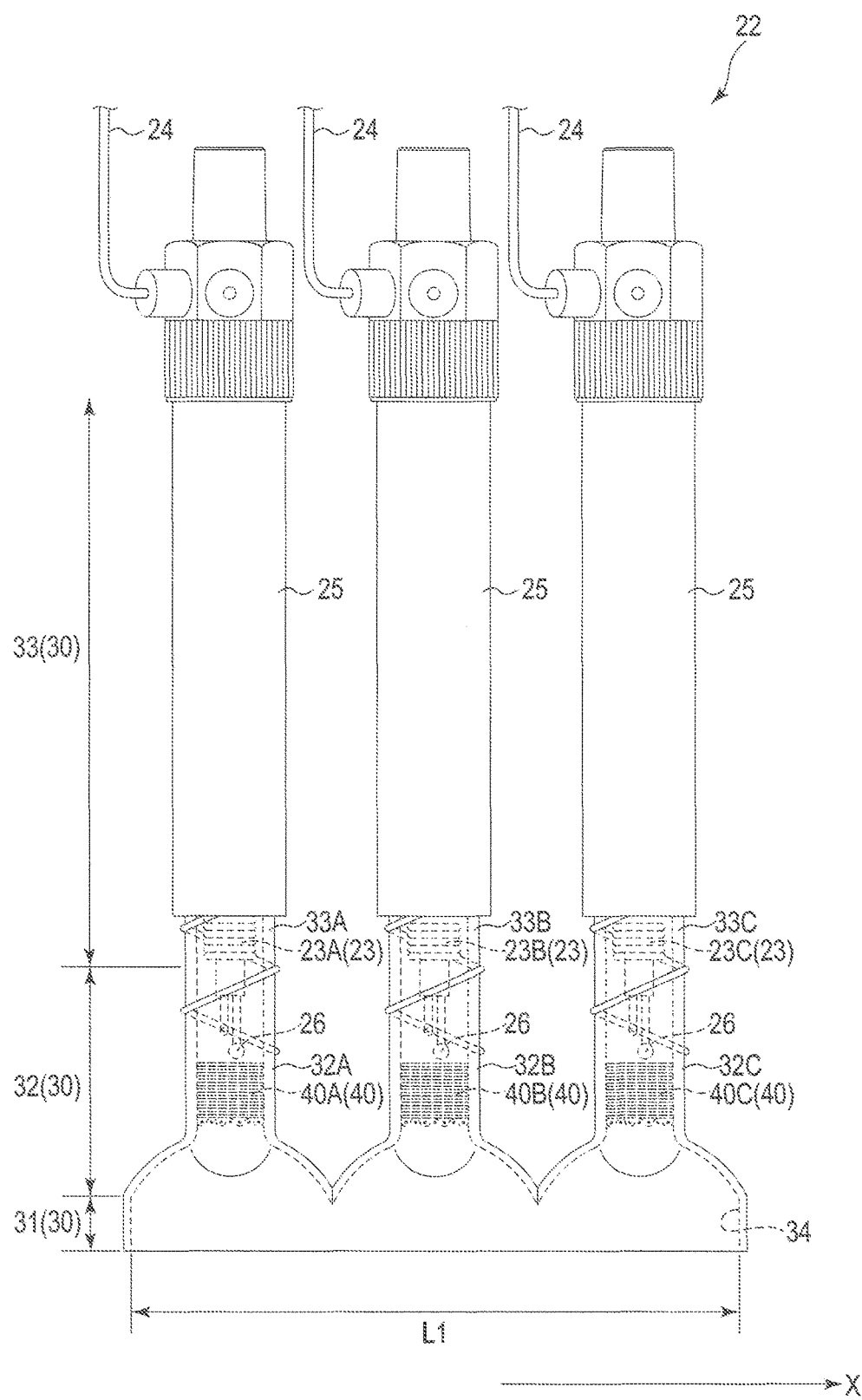
F I G. 5

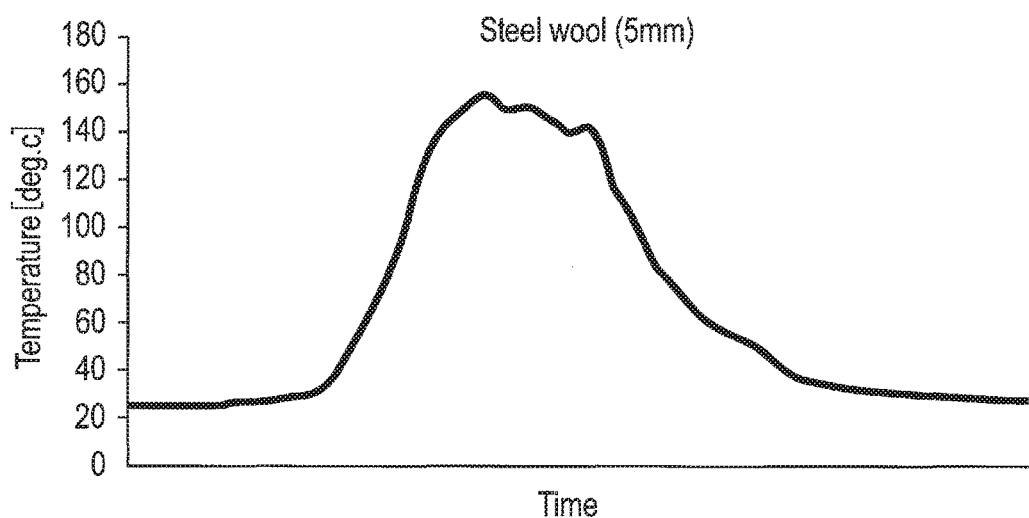
F I G. 10
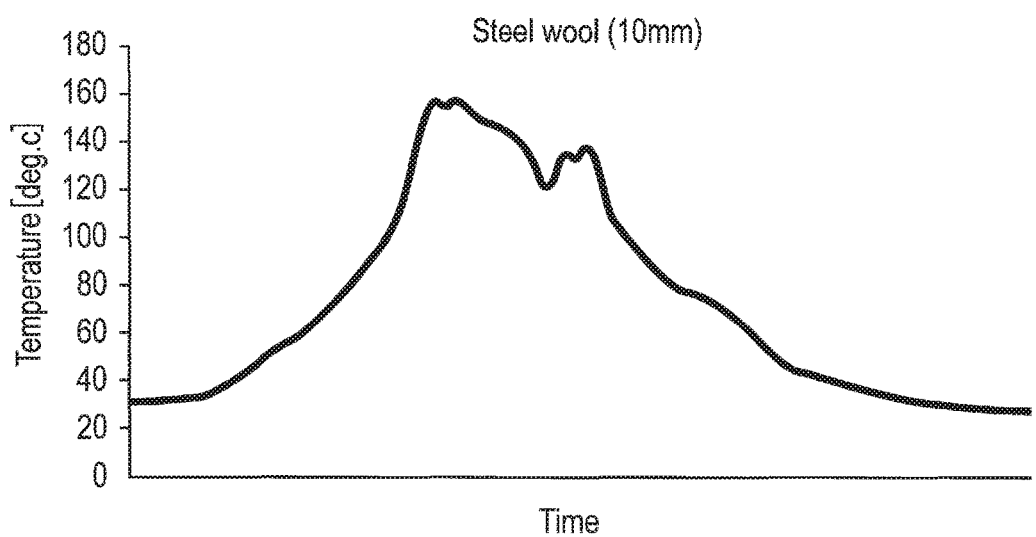
F I G. 11

ELECTRONIC DEVICE MANUFACTURING APPARATUS

CROSS-REFERENCE TO RELATED APPLICATIONS

This application is based upon the prior Japanese Patent Application No. 2016-082344 filed Apr. 15, 2016, the entire contents of which are incorporated herein by reference.

BACKGROUND OF THE INVENTION

1. Field of the Invention

The present invention relates to an electronic device manufacturing apparatus which can mount electronic components fixed by a conductive adhesive agent with high positional accuracy.

2. Description of the Related Art

Suspensions of hard disk drives with a microactuator configured to drive a magnetic head finely with high accuracy are known. Unlike some electronic components such as a condenser, the positional accuracy of the microactuator influences dynamic characteristics such as stroke unevenness, resonance, and the like. Furthermore, it influences adhesion reliability in a long term. Therefore, in mounting of a microactuator, not only high reliable electric connection but also higher positional accuracy are required.

Since a piezoelectric element of a microactuator loses the polarization in a high temperature and loses a piezoelectric effect, and thus, mounting thereof must be performed under a Curie temperature. In adhesion of electronic components such as a microactuator which are vulnerable to a high temperature, a conductive adhesive agent in which conductive fillers are dispersed in a main agent is used instead of soldering (for example, refer to JP2001-217499A and JPH7-106749A). If a conductive adhesive agent is applied and then shaken before curing or is kept for a long time, the conductive fillers are shifted in the main agent and the connection conductivity may be unstable after curing of the agent. In consideration of this point, the conductive adhesive agent must be cured as soon as possible after its application.

However, in order to cure the conductive adhesive agent, a work must be put in a heat chamber and heated for approximately one hour. Since this process is longer than other processes, curing of the conductive adhesive agent continuously with other processes is difficult in respect of tactfulness and putting the conductive adhesive agent is performed as a batch process.

Thus, in a waiting time until a heat curing process, a conductive adhesive agent is applied to a piezoelectric element, positioning of the piezoelectric element is performed, and then a high temperature inert gas is locally blow to the conductive adhesive agent for a short period of time for preliminary heating in order to make the main agent uncured in a gel form to prevent the shift of conductive fillers. However, a microactuator mounted on a suspension of a hard disk drive is very small. If the amount of inert gas to be blown is too much, the microactuator positioned already may move. If the amount of inert gas to be blown is too small, the temperature of the inert gas becomes uneven. Especially, if a plurality of heaters are used to heat inert gas, the temperature of the inert gas decreases in adjacent two heaters. The temperature of the inert gas is required to be stable by delicate wind which does not harm the positional accuracy of the microactuator.

BRIEF SUMMARY OF THE INVENTION

The object of the present invention is to provide an electronic device manufacturing apparatus which can mount electronic components fixed by a conductive adhesive agent with highly positional accuracy where the electronic components may be a microactuator mounted on a suspension of a hard disk drive.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 shows an example of a series of processes to mount a piezoelectric element to a work.

FIG. 4 is a perspective view showing an example of an electronic device manufacturing apparatus of an embodiment.

FIG. 5 is a front view showing an example of a preliminary heating device of FIG. 4.

FIG. 10 shows a chronological change of a surface temperature of a work in a second referential example.

FIG. 11 shows a chronological change of a surface temperature of a work in a third referential example.

DETAILED DESCRIPTION OF THE INVENTION

Hereinafter, an electronic device manufacturing apparatus of an embodiment will be explained with reference to FIGS. 1 to 14.

Figure 1:
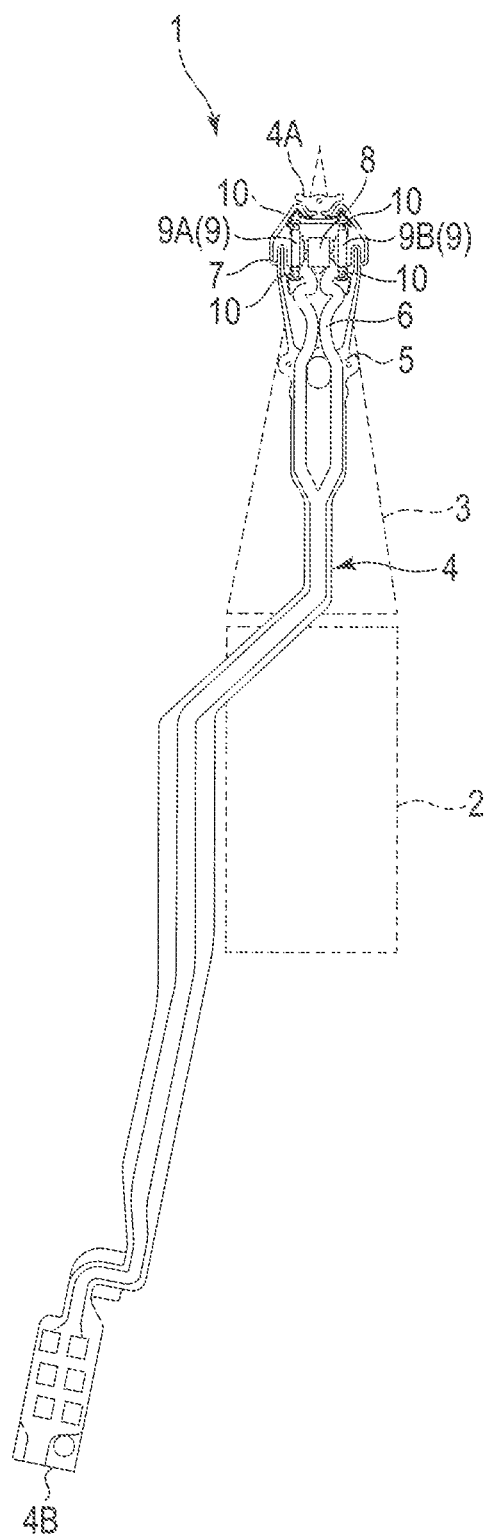
FIG. 1 is a plan view showing an example of an electronic device manufactured by an electronic device manufacturing apparatus of an embodiment.

FIG. 1 shows a suspension 1 of a hard disk drive (HDD) manufactured by an electronic device manufacturing apparatus (suspension manufacturing apparatus) 20 of an embodiment. The hard disk drive includes a magnetic disk which rotates around a spindle and a carriage which rotates around a pivot axis. The suspension 1 of FIG. 1 is provided with an arm of the carriage. The suspension 1 includes a base plate 2 fixed to the arm, an elastic load beam 3, and flexure 4 with conductors disposed to overlap the load beam 3.

The flexure 4 includes a metal base 5 formed of a thin stainless steel plate and a conductive line 6 formed on the metal base 5. A gimbal part 7 is formed in the proximity of a tip 4A of the flexure 4. At a tongue part in the center of the gimbal part 7, a slider 8 is mounted. A magnetic head provided with the slider 8 accesses a recording surface of a magnetic disk to read/write data. A head gimbal assembly includes the slider 8, flexure 4, load beam 3, and the like.

A suspension manufactured by the present embodiment is, for example, a dual stage actuator type suspension (DSA suspension). In order to position the magnetic head with respect to the recording surface of the hard disk with higher accuracy, a microactuator 9 which finely drives the magnetic head alone with high accuracy is used in addition to a voice coil motor which rotates the carriage.

Microactuators 9 (9A and 9B) are mounted on the gimbal part 7 of the flexure 4, and are provided with both ends of the tongue part where the slider 8 is mounted. Note that the microactuators 9 may be mounted on a part different from the gimbal part 7. Ends of the microactuator 9 are electrically connected and physically fixed to an electrode provided with the gimbal part 7 by a conductive adhesive agent 10, respectively. The electrode connected with the microactuator 9 is electrically connected to a conductive line 6 extending toward a proximal end 4B of the flexure 4. The microactuator 9 is an example of electronic components fixed by a conductive adhesive agent. The suspension 1 is an example of an electronic device including electronic components fixed by a conductive adhesive agent.

The microactuator 9 is formed of a piezoelectric element including a piezoelectric element such as lead zirconate titanate (PZT) treated suitably. In the example depicted, the piezoelectric element is treated to be 0.8 mm in length, 0.2 mm in width, and 0.08 mm in thickness. A Curie temperature (Tc) at which the piezoelectric element of the microactuator 9 loses its polarity and piezoelectric effect is, for example, 300 to 350° C.

The conductive adhesive agent 10 includes a main agent (binder) and conductive fillers dispersed in the main agent. The main agent of the conductive adhesive agent 10 is, for example, a thermal-cured resin which is cured in a temperature lower than the Curie temperature of the piezoelectric element of the microactuator 9. For example, the conductive adhesive agent 10 is a silver paste. A silver paste includes a main agent such as an epoxy resin and silver powders dispersed in the main agent, and for example, can be thermally cured (cured) when heated in a temperature of 150 to 250° C. for an hour. Note that the conductive adhesive agent 10 is not limited to the above example, and other conductive adhesive agents which can be cured in a temperature lower than that of soldering can be used.

Figure 2:
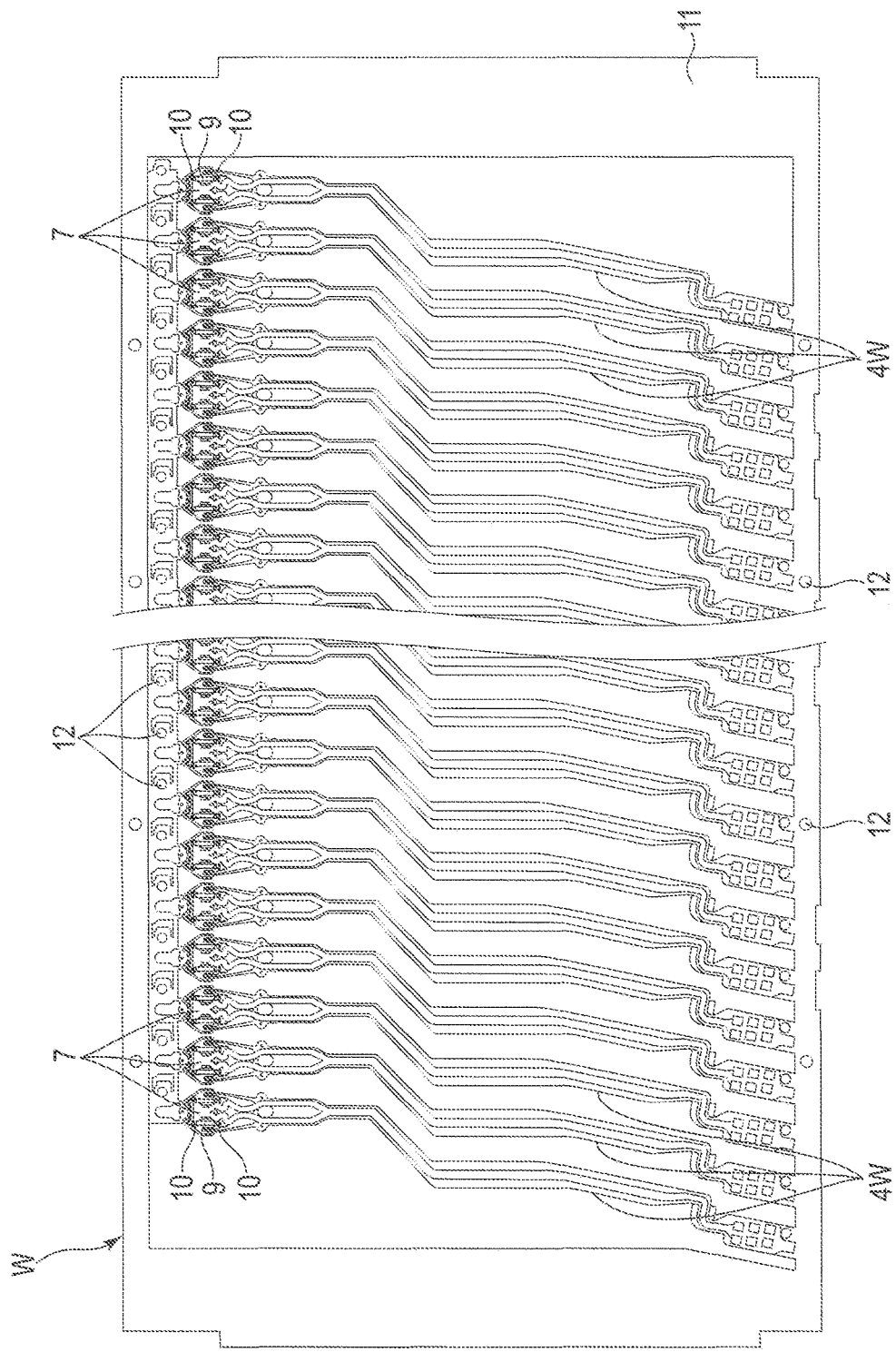
FIG. 2 is a plan view showing an example of a work processed by the electronic device manufacturing apparatus of the embodiment.

FIG. 2 is an example of a work W treated by the electronic device manufacturing apparatus 20 of the present embodiment. The work W is, for example, a flexure chain sheet in which a plurality of flexure elements 4W are chained.

The work W is formed by, for example, etching a single plate of stainless steel plate (metal base 5), and includes a large number (a few dozens to a few hundreds) of flexure elements 4W of same shape. Each flexure element 4W has a structure similar to the flexure 4 and the flexure 4 is obtained when divided. The work W further includes a frame 11 by which the flexure element 4W is fixed. The frame 11 includes a plurality of positioning holes 12. Positioning pins of a work carrier 21W (shown in FIG. 4) in which the work W is accommodated are inserted into the positioning holes 12.

FIG. 3 shows an example of a series of processes to mount the microactuator 9 on a work. In the example of FIG. 3, initially, a work which is before the work W of FIG. 2 is conveyed into a production line.

To the positions of the electrodes in the gimbal part 7 of the flexure elements 4W of the work conveyed on the conveyer, a conductive adhesive agent 10 is applied by a dispenser or the like (ST1). On the conductive adhesive agent 10 applied as above, a piezoelectric element of the microactuator 9 is disposed, and the work W of FIG. 2 is obtained (ST2).

The conductive adhesive agent 10 is preliminarily heated by blowing a high temperature inert gas thereto and the conductive adhesive agent 10 is gelled (ST3). A temperature of the inert gas is, for example, approximately 160° C. and heated for 15 to 60 seconds.

Whether or not the piezoelectric element is disposed in the right position is checked by inline inspection with an image processing device or the like (ST4). A coating agent is applied to end surfaces of the metal base 5 of the work W to prevent micro burrs from detaching (ST5). Ultraviolet is irradiated to the coating agent for rough curing (ST6). The work W is conveyed to a batch type heat chamber from the conveyer and the conductive adhesive agent 10 is cured by heating in the chamber for an hour (ST7). The mount of the piezoelectric element is completed.

In the present embodiment, a new feature is added to step ST3 that is in the series of processes. The electronic device manufacturing apparatus 20 blows a delicate wind to the conductive adhesive agent 10 so that the conductive adhesive agent 10 gels and the fluidity thereof is lost without moving the positioned electronic components.

The electronic device manufacturing method of the present embodiment includes step ST3 in which the conductive adhesive agent 10 is preliminarily heated, and thus, even if there is a waiting time until step ST7 in which the conductive adhesive agent 10 is cured, the conductive fillers do not cohere in the center of the main agent of the conductive adhesive agent 10 or do not accumulate on the bottom of the main agent of the conductive adhesive agent 10.

In step ST1, the work W is formed by applying an uncured conductive adhesive agent 10 to the electrodes provided with the gimbal part 7 of the flexure elements 4W. Then the work is conveyed into step ST3 in which the electronic device manufacturing apparatus 20 of the present embodiment is used to the conductive adhesive agent 10 on which microactuators 9 (piezoelectric element) are disposed.

FIG. 4 is a perspective view showing an example of the electronic device manufacturing apparatus of an embodiment. As shown in FIG. 4, the electronic device manufacturing apparatus 20 includes a conveyer 21 and a preliminary heating device 22 which preliminarily heats the work W.

The conveyer 21 conveys the work W from step ST2 to step ST4. The work W passing through step ST3 is accommodated in the work carrier 21W added to the conveyer 21. A conveying direction X of conveying the work W is denoted by an arrow, and a locus Y of the conductive adhesive agent 10 moves along the work W is denoted by a double-dotted line.

The preliminary heating device 22 includes a plurality of (three, for example) heaters 23 (23A, 23B, and 23C), gas supply source 24, and nozzle unit 30.

The heaters 23 (23A, 23B, and 23C) are opposed to the conveyer 21 from the above and are arranged in the conveying direction X of the conveyer 21 at intervals. The gas supply source 24 supplies an inert gas such as nitrogen to the heaters 23A, 23B, and 23C. The inert gas of 6 L/min is supplied from the gas supply source 24 and is distributed evenly to the heaters 23 (23A, 23B, and 23C). The nozzle unit 30 is formed of a fused quartz or the like and is attached to the heater 23A, 23B, and 23C.

The nozzle unit 30 includes a narrow path part 31, a plurality of (three, for example) guide parts 32 (32A, 32B, and 32C), and a plurality of (three, for example) proximal ends 33 (33A, 33B, and 33C).

The narrow path part 31 is disposed between the heaters 23 (23A, 23B, and 23C) and the conveyer 21. The narrow path part 31 includes narrow path 34 which gathers the inert gas passing the heaters 23. The narrow path 34 is a flow path for the inert gas vertically passing through the narrow path part 31, and formed as a narrow opening extending along the locus Y of the conductive adhesive agent 10. The lower end of the narrow path part 31 is opposed to the work W conveyed to the conveyer 21 with a slight gap therebetween. A gap between the narrow path part 31 and the work W is, for example, 5 mm.

The guide parts 32 (32A, 32B, and 32C) are disposed between the heaters 23 (23A, 23B, and 23C) and the narrow path part 31. The inert gas passing the heaters 23A, 23B, and 23C flow into the guide parts 32A, 32B, and 32C. The guide parts 32A, 32B, and 32C connect the heaters 23A, 23B, and 23C with the narrow path part 31, and guide and gather the inert gas passing the heaters 23A, 23B, and 23C to the narrow path 34.

The proximal ends 33 (33A, 33B, and 33C) extend toward the gas supply source 24 from the guide parts 32 (32A, 32B, and 32C). The proximal ends 33A, 33B, and 33C are each formed as, for example, a cylinder and accommodate heaters 23A, 23B, and 23C.

In the guide parts 32 (32A, 32B, and 32C), gas dispersion members 40 (40A, 40B, and 40C) are stacked, respectively. The gas dispersion member 40 stores the heat of the heater 23 and disperses the inert gas passing the heater 23. The gas dispersion member 40 includes a plurality of wire meshes layered in the flow direction of the inert gas (the vertical direction in the example of FIG. 4).

Figure 6:
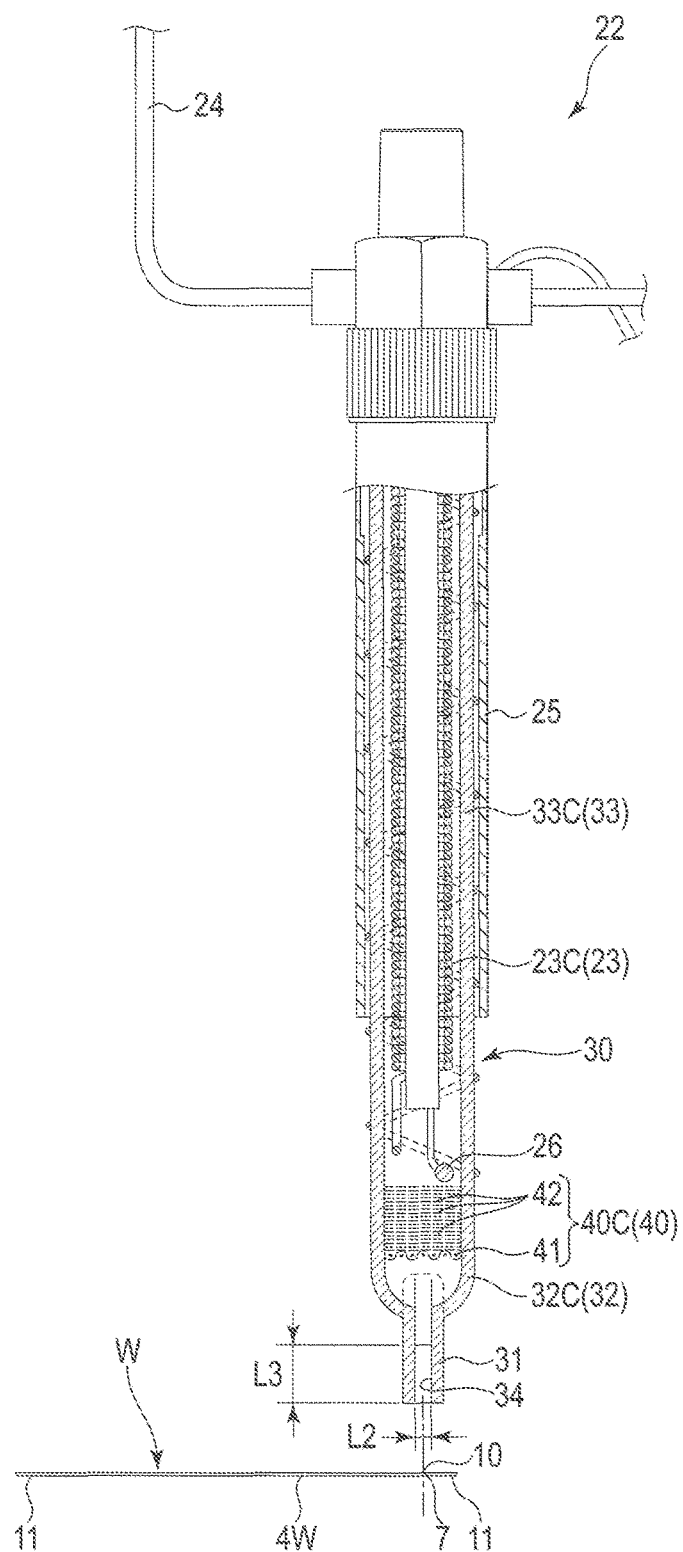
FIG. 6 is a right side view showing an example of the preliminary heating device of FIG. 4 in a partly omitted manner.

FIG. 5 is a front view showing an example of the preliminary heating device 22. FIG. 6 is a right side view showing the preliminarily heating device 22 of FIG. 5 in a partly omitted manner. The preliminarily heating device 22 will further be examined with reference to FIGS. 5 and 6.

The heater 23 is, for example, a spirally-wound electrically-heated wire. In the example depicted, a bracket 25 and a thermocouple 26 are added to the heaters 23 (23A, 23B, and 23C), respectively. The bracket 25 is disposed to surround the heaters 23 and is formed as a cylinder having a diameter slightly greater than the outer diameter of the proximal ends 33 of the nozzle unit 30. The proximal end 33 is inserted between the heater 23 and the bracket 25.

The nozzle unit 30 includes, at the narrow path part (tip part) 31, the narrow path 34 formed along the locus Y of the conductive adhesive agent 10 passing the proximity of the heaters 23. A width of the narrow path 34 in the conveying direction X is given as a first width L1 (as shown in FIG. 5), a width of the narrow path 34 in the direction orthogonal to the conveying direction X is given as a second width L2 (as shown in FIG. 6), and a length of the narrow path 34 in the vertical direction is given as a flow path length L3 (as shown in FIG. 6), the second width L2 is formed narrower as compared to the first width L1 and the flow path length L3. The first width L1 is, for example, 80 mm. The second width L2 is, for example, 2 mm. The flow path length L3 is, for example, 7 mm.

The outer diameter of the heater 23 is, for example, 9 to 10 mm. The second width L2 is formed narrower as compared to the outer diameter of the heater 23. The heaters 23 adjacent to each other are arranged with a gap therebetween which is greater than the outer diameter of the heater 23.

The guide part 32 has a cross-sectional view similar to the proximal end 33 in the proximal end 33 side. In the example of FIG. 6, the guide part 32 is formed as a cylinder. As to the shape of the guide part 32 in the narrow path part 31 side, the width in the direction orthogonal to the conveying direction X is tapered toward the narrow path part 31, and the width in the conveying direction X is formed to widen toward the narrow path part 31. The guide part 32 guides the inert gas passing the heaters 23 to the narrow path 34.

The gas dispersion members 40 (40A, 40B, and 40C) stacked in the guide parts 32 are formed of, for example, layered wire meshes.

Figure 7:
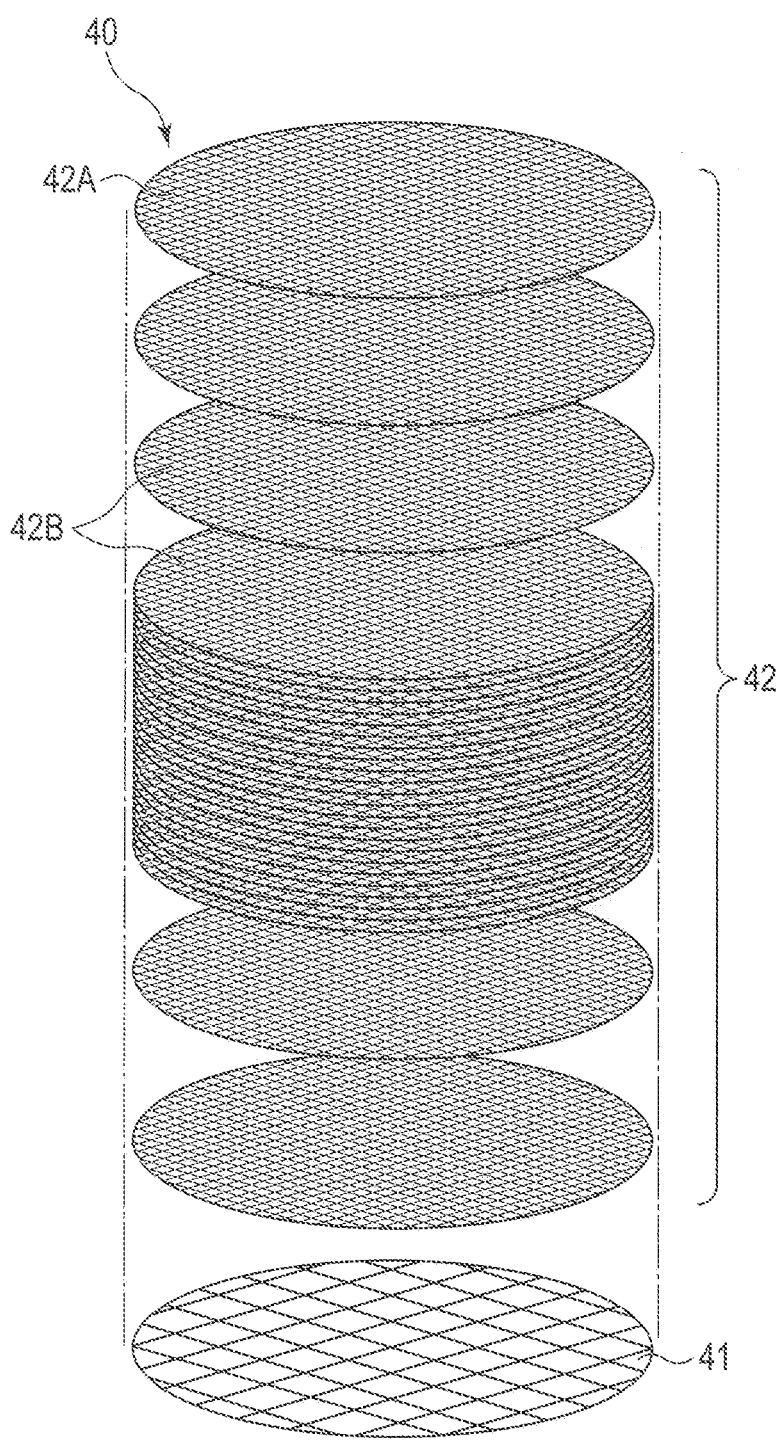
FIG. 7 is a perspective view showing an example of a gas dispersion member of FIG. 4.

FIG. 7 is a perspective view showing an example of the gas dispersion member 40. In the example depicted, the gas dispersion member 40 is formed of two kinds of wire meshes of different permeabilities. Two kinds of wire meshes are first wire mesh 41 and a second wire mesh 42. The first wire mesh 41 is formed rougher than the second wire mesh 42, and formed of wide wires. For example, the first wire mesh 41 is 30 mesh stainless wire mesh having a line diameter of 0.29 mm, opening of 0.56 mm, and aperture ratio of 43.4%. For example, the second wire mesh 42 is 100 mesh stainless wire mesh having a line diameter of 0.10 mm, opening of 0.15 mm, and aperture ratio of 36.0%. Note that the gas dispersion member 40 may be formed of a combination of wire meshes of three kinds or more. Or, the gas dispersion member 40 may be formed of one kind of wire mesh.

In the example depicted, on first wire mesh 41 is disposed in the lowest layer and thirty to thirty five second wire meshes 42 are randomly layered on the first wire mesh 41 without alignment. As described above, the guide parts 32 are tapered in the narrow path part 31 side in the direction orthogonal to the conveying direction X. The first wire mesh 41 formed of steel wires of wide diameter contacts the inner wall of the guide part 32 and supports the second wire mesh 42 to prevent deformation and falling thereof. Note that the first wire mesh 41 may be omitted if the second wire meshes 42 are sufficiently rigid.

Furthermore, the outer diameters of the second wire meshes 42 may be the same or may be different from each other. For example, the outer diameter of the uppermost second wire mesh 42A may be formed greater than the outer diameter of the other second wire meshes 42B, and the second wire mesh 42A may contact the inner wall of the guide part 32. If the second wire meshes 42B randomly layered are supported by the first wire mesh 41 and the second wire mesh 42A contacting the inner wall of the guide part 32, the second wire meshes 42B do not move or incline by vibration of the electronic device manufacturing apparatus 20.

Figures 8, 9:
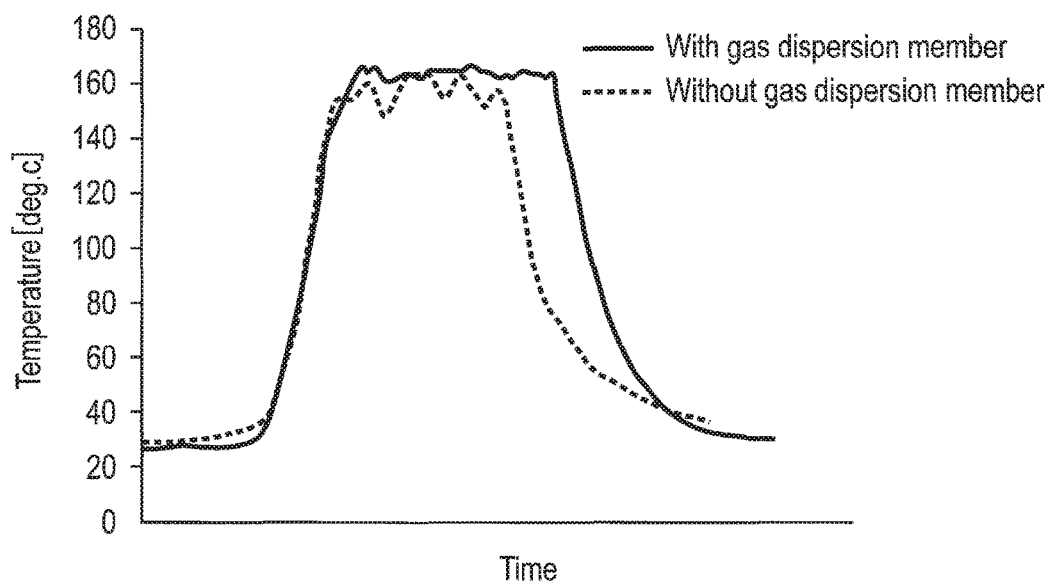
FIG. 8 shows a chronological change of a surface temperature of a work passing through the preliminary heating device.
FIG. 9 shows a chronological change of a surface temperature of a work in a first referential example.

FIG. 8 shows a chronological change in a surface temperature of the work W in step ST3. The surface temperature of the work W is measured at the gimbal part 7 of the head one of the flexure elements 4W. In the figure, a solid line indicates a result measured when the electronic device manufacturing apparatus 20 of the present embodiment including the gas dispersion member 40 of FIG. 7 is used. In the figure, a dotted line indicates a result measured when an electronic device manufacturing apparatus of the present embodiment from which the gas dispersion member 40 is omitted is used.

In the result measured when the electronic device manufacturing apparatus from which the gas dispersion member 40 is omitted, the surface temperature of the work W decreases when the measurement point passes between the heaters 23A and 23B and the heaters 23B and 23C and a temperature profile shows some valleys. On the other hand, in the result measured with the apparatus of the present embodiment, the temperature is stable and a temperature profile shows a flat peak graph.

Now, first to sixth referential examples will be explained with reference to FIGS. 9 to 14. In the first to sixth referential examples, an electronic device manufacturing apparatus which has a single heater 23 is used to evaluate various types of gas dispersion members 40.

Specifically, an electronic device manufacturing apparatus 20 of FIG. 4 from which heaters 23B and 23C, guide parts 32B and 32C, proximal ends 33B and 33C, gas dispersion members 40B and 40C are omitted is used to evaluate chronological changes of surface temperature of the work W with different settings of the gas dispersion member 40 stacked in the guide part 32A.

In the first referential example, the gas dispersion member 40 is not stacked in the guide part 32A. FIG. 9 shows a result thereof. In the second referential example, a steel wool having a thickness of 5 mm is charged in the guide part 32A as the gas dispersion member 40. FIG. 10 shows a result thereof. In the third referential example, a steel wool having a thickness of 10 mm is charged in the guide part 32A. FIG. 11 shows a result thereof.

Figure 12:
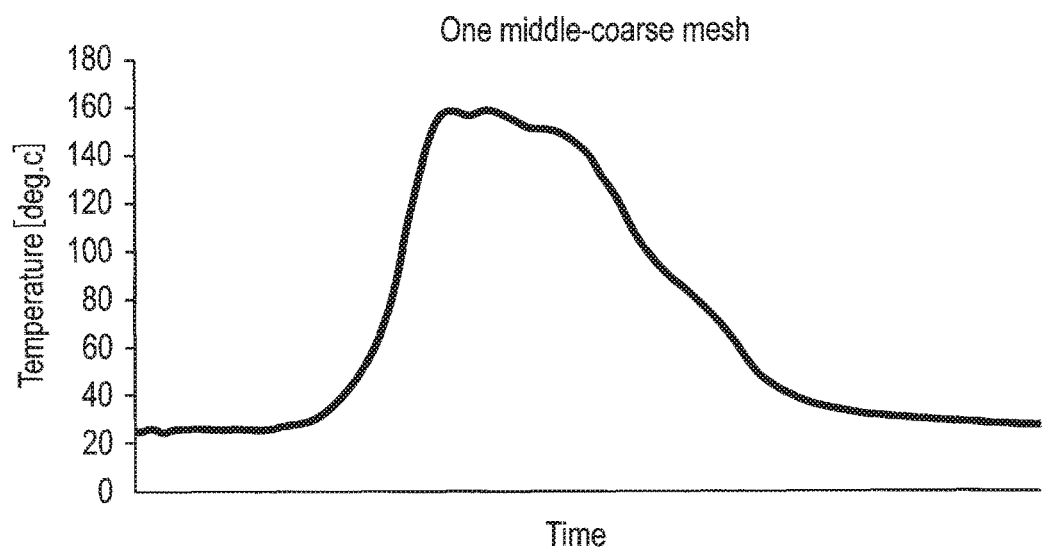
FIG. 12 shows a chronological change of a surface temperature of a work in a fourth referential example.
Figure 13:
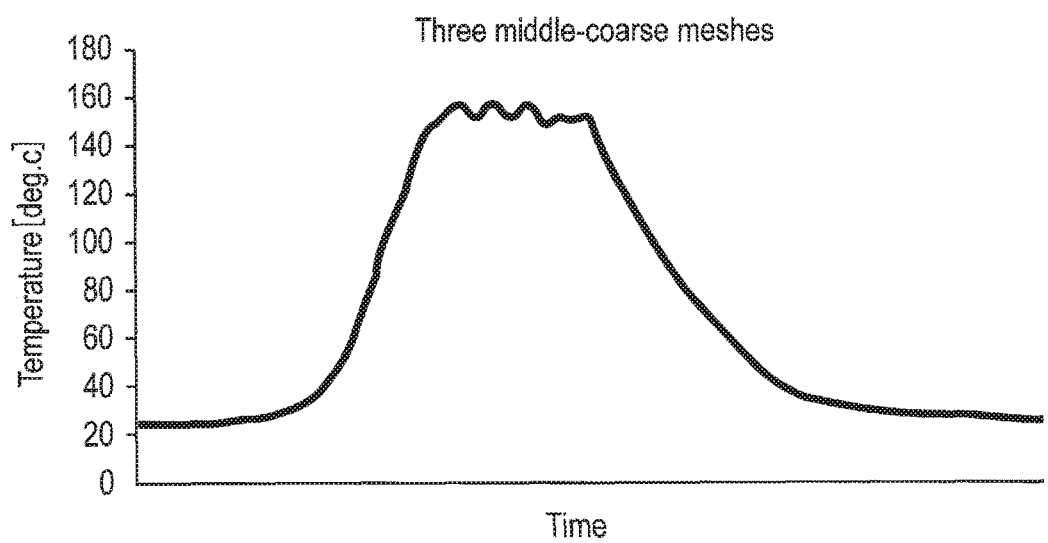
FIG. 13 shows a chronological change of a surface temperature of a work in a fifth referential example.
Figure 14:
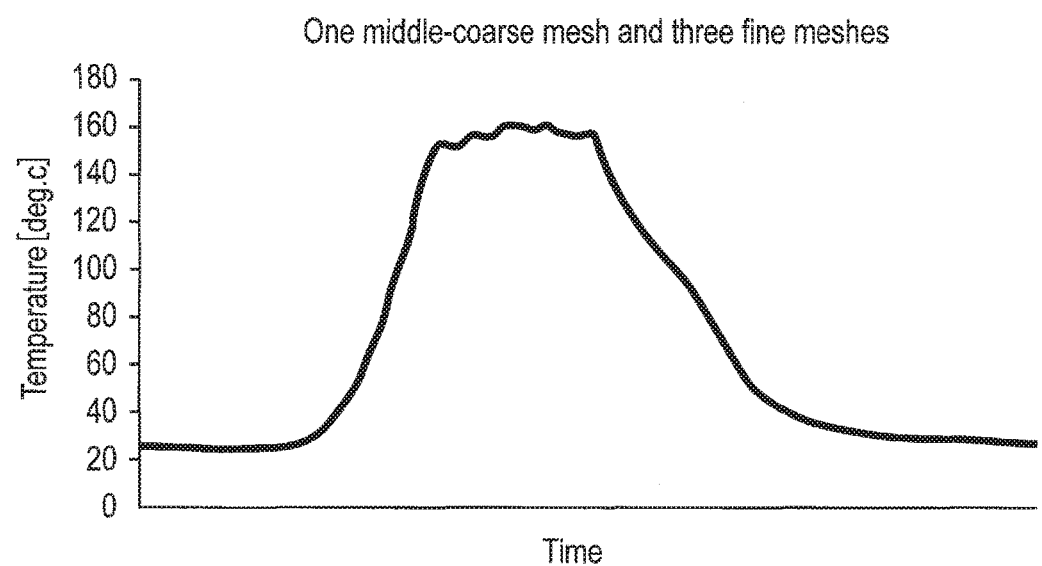
FIG. 14 shows a chronological change of a surface temperature of a work in a sixth referential example.

In the fourth referential example, one first wire mesh 41 (middle coarse mesh) is stacked in the guide part 32A as the gas dispersion member 40. FIG. 12 shows a result thereof. In the fifth referential example, three first wire meshes 41 are layered and stacked in the guide part 32A as the gas dispersion member 40. FIG. 13 shows a result thereof. In the sixth referential example, one first wire mesh 41 and three second wire meshes 42 (fine mesh) layered thereon are stacked in the guide part 32A as the gas dispersion member 40. FIG. 14 shows a result thereof.

As shown in FIG. 9, the first referential example in which the gas dispersion member 40 is omitted, a temperature profile shows a steep peak. As shown in FIG. 10, the second referential example in which a thin steel wool is used as the gas dispersion member 40, a temperature profile shows a slightly flat peak as compared to the first referential example. However, as shown in FIG. 11, the third referential example in which a thicker steel wool is used as the gas dispersion member 40 shows an unstable temperature profile. When a size of the gas dispersion member is small as in the present embodiment, a steel wool with an even density is difficult to prepare and a pressure loss may vary.

As shown in FIG. 12, the fourth referential example in which one first wire mesh 41 is used as the gas dispersion member 40 shows a temperature profile more stable as compared to the first referential example; however, the result is not significantly different from the second referential example. As shown in FIG. 13, the fifth referential example in which three first wire meshes 41 are used as the gas dispersion member 40 shows a temperature profile with flatter peak as compared to the fourth referential example. As shown in FIG. 14, the sixth referential example in which one first wire mesh 41 and three second wire meshes 42 are layered as the gas dispersion member 40 shows a temperature profile more stable as compared to the fifth referential example. Thereafter, when the number of fine meshes increases, the peak in temperature profiles becomes flat from one end to the other end of the narrow path 34, and the temperature profile becomes most stable in the electronic device manufacturing apparatus 20 of FIG. 4 in which one middle coarse mesh and thirty to thirty five fine meshes are combined.

With the electronic device manufacturing apparatus 20 of the present embodiment structured as above includes a gas supply source 24 and heaters 23 and supplies a high temperature inert gas. Right after step ST3 in which a piezoelectric element is disposed on an uncured conductive adhesive agent 10, the high temperature inert gas is blown to the conductive adhesive agent 10 and a main agent of the conductive adhesive agent 10 is gelled while being maintained uncured. The fluidity of the conductive adhesive agent 10 can be lost before conductive fillers are cohered, and thus, electrical reliability of the microactuator 9 can be secured.

The present embodiment includes a plurality of heaters 23 (23A, 23B, and 23C) arranged in the conveying direction X of the conveyer 21. If the number of the heaters 23 is increased/decreased, a time of preliminary heating of the conductive adhesive agent 10 in step ST3 can be adjusted without changing a feeding speed of the conveyer 21 which greatly influences other processes.

The present embodiment includes, in a narrow path part (tip part) 31, a narrow path 34 which gathers the inert gas passing each of the heaters 23. Since the inert gas can be mixed in the narrow path 34, unevenness of the heaters 23 can be suppressed and the surface temperature of the work W can be stabilized. Since the narrow path 34 opens narrowly, the inert gas can be used efficiently for preliminary heating and the amount of inert gas can be reduced.

If a large amount of inert gas is blown in a wide area, a wind from a slant angle may move the microactuator 9. In the present embodiment, the narrow path 34 is opposed to a locus Y of the conductive adhesive agent 10 and a small amount of inert gas can hit the conductive adhesive agent 10. A delicate wind from the directly above can be used for preliminary heating of the conductive adhesive agent 10, and thus, the microactuator 9 can be mounted with high positional accuracy.

The present embodiment includes a gas dispersion member 40 stacked in a guide part 32. The gas dispersion member 40 disperses the strength of the inert gas sent straight from the heaters 23, and prevents the microactuator 9 from moving by a blow, and thus, the microactuator 9 can be mounted with high positional accuracy.

The gas dispersion member 40 disperses the inert gas sent straight from the heaters 23 in different directions, and thus, the inert gas guided by the guide part 32A goes to a boundary to the adjacent guide part 32B. Similarly, the inert gas guided by the guide part 32B goes to a boundary between the adjacent guide parts 32A and 32C. The inert gas guided by the guide part 32C goes to a boundary to the adjacent guide part 32B.

Since the inert gas as a heating medium is sufficiently supplied to boundaries of the guide parts 32A, 32B, and 32C, a decrease in the temperature in the boundaries caused by decrease of the inert gas can be suppressed and the surface temperature of the work W can be stabilized. Since the heating is performed stably such that the conductive adhesive agent 10 loses its fluidity, the electric reliability of the microactuator 9 can further be improved.

If the temperature of the inert gas is lower than that of the gas dispersion member 40, the gas dispersion member 40 heats the inert gas to increase the temperature. If the temperature of the inert gas is higher than that of the gas dispersion member 40, the gas dispersion member 40 absorbs the heat of the inert gas to decrease the temperature. Since the gas dispersion member 40 suppresses unevenness in the temperature of the inert gas, the surface temperature of the work W can be stabilized.

The present embodiment includes a gas dispersion member 40 including a combination of a first wire mesh 41 and a plurality of second wire meshes 42. With the second wire meshes 42 with fine mesh, the inert gas can be dispersed evenly. By increasing/decreasing the number of the second wire meshes 42, a pressure loss of the gas dispersion 40 can be adjusted in accordance with the first width L1 of the narrow path. A time of preliminary heating of the conductive adhesive agent 10 in step ST3 can be adjusted without changing the feeding speed of the conveyer 21.

When the number of the second wire meshes 42 increases, the second wire meshes 42 gradually warp by the weight thereof. If the weight exceeds a limit, the second wire meshes 42 may possibly fall. In the present embodiment, the first wire mesh 41 formed of steel wires wider than that of the second wire meshes 42 is disposed in the lowermost layer to support the second wire meshes 42. Thus, even if the number of the second wire meshes 42 is increased, a possible fall of the second wire meshes 42 can be prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

For example, instead of layering a large number of wire meshes of similar shape, a gas dispersion member may be formed by winding a band shaped wire mesh or by folding a band shaped wire mesh in a zigzag manner. In that case, at least a part of the guide part may be formed in a square tube to match the gas dispersion member. The lowermost first wire mesh may not be a wire mesh. If it sufficiently prevents deformation and falling of the second wire meshes, the first wire mesh may be a ring or the like contacting the guide part. Or, protrusions or the like may be provided with the inner wall of the guide part while omitting the first wire mesh.

The present invention is used in mounting of various electronic components which are fixed by a conductive adhesive agent and require high positional accuracy. Especially, the present invention is suitable for manufacturing of suspensions of a hard disk drive. Electronic components related to a suspension of a hard disk drive are not limited to microactuators and may be light emitting elements used in heat assisted magnetic recording. As an example of the electronic components, there is an actuator provided with a camera of a smartphone or the like to perform fine driving of a lens in order to suppress shaking. As another example of the electronic components, there is an actuator of a varifocal lens used in catheter or the like. The actuator is a piezoelectric element which reforms an elastic lens.

What is claimed is:

1. An electronic device manufacturing apparatus which manufactures an electronic device including electronic components fixed by a conductive adhesive agent, the apparatus comprising:
   a conveyor which conveys a work to which uncured conductive adhesive agent is applied;
   a plurality of heaters opposed to the conveyor, the heaters being arranged at intervals;
   a gas supply source which supplies an inert gas to each of the heaters;
   a narrow path part including a narrow path formed locally along a locus in which the conductive adhesive agent passes, the narrow path part being disposed between the heaters and the conveyor to gather the inert gas passing through the heaters; and
   a plurality of guide parts connecting the heaters and the narrow path part to guide the inert gas passing through the heaters to the narrow path,
   wherein:
   each of the guide parts includes a gas dispersion member which stores heat from a connected heater and disperses the inert gas passing through the connected heater,
   each gas dispersion member includes a plurality of wire meshes layered in a direction of a flow of the inert gas, and
   each of the pluralities of wire meshes includes at least two wire meshes of different permeabilities.

2. The electronic device manufacturing apparatus of claim 1, wherein:
   the electronic device is a suspension of a hard disk drive including a microactuator fixed by the conductive adhesive agent, and
   the work is a flexure chain sheet in which a plurality of flexure elements are chained and the uncured conductive adhesive agent is applied to each of the flexure elements.

* * * * *